United States Patent
Best et al.

(10) Patent No.: US 7,494,828 B2
(45) Date of Patent: Feb. 24, 2009

(54) SUBSTRATE HOLDER AND DEVICE MANUFACTURING METHOD

(75) Inventors: Keith Frank Best, Best (NL); Johannes Wilhelmus Maria Krikhaar, Veldhoven (NL); Rudy Jan Maria Pellens, Overpelt (BE)

(73) Assignee: ASML Netherlands B.V., Veldhoven (NL)

( * ) Notice: Subject to any disclaimer, the term of this patent is extended or adjusted under 35 U.S.C. 154(b) by 128 days.

(21) Appl. No.: 11/195,864

(22) Filed: Aug. 3, 2005

(65) Prior Publication Data

US 2007/0037077 A1  Feb. 15, 2007

(51) Int. Cl.
*H01L 21/66* (2006.01)
(52) U.S. Cl. .............. 438/14; 438/15; 438/16; 438/17; 438/18; 438/943; 438/946; 355/78; 355/95; 355/99; 355/53
(58) Field of Classification Search ............. 438/14–18, 438/943, 946; 355/78, 95, 99, 53
See application file for complete search history.

(56) References Cited

U.S. PATENT DOCUMENTS

| | | | |
|---|---|---|---|
| 6,583,858 B2 | 6/2003 | van Schaik et al. | |
| 6,822,730 B2 | 11/2004 | Krikhaar et al. | |
| 2005/0094120 A1* | 5/2005 | Sekigawa et al. | 355/67 |
| 2007/0111116 A1* | 5/2007 | Noudo et al. | 430/22 |
| 2007/0128556 A1* | 6/2007 | Hasegawa et al. | 430/311 |

OTHER PUBLICATIONS

U.S. Appl. No. 11/170,735, filed Jun. 30, 2005.

* cited by examiner

*Primary Examiner*—Fernando L Toledo
*Assistant Examiner*—Jae Lee
(74) *Attorney, Agent, or Firm*—Pillsbury Winthrop Shaw Pittman LLP

(57) ABSTRACT

A second substrate, e.g. a III/V compound semiconductor, is placed on a first substrate, e.g. a wafer, in the vicinity of placement marks on the first substrate. The second substrate is exposed to patterned radiation, e.g. for the manufacture of integrated circuits.

15 Claims, 3 Drawing Sheets

SUBSTRATE HOLDER AND DEVICE MANUFACTURING METHOD

FIELD

The present invention relates, inter alia, to substrate holders, alignment, device manufacturing methods, and devices manufactured therewith.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, e.g. a mask/reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is generally via imaging onto a layer of radiation-sensitive material (resist) provided on the substrate. Often, a single substrate will contain a network of adjacent target portions that are successively patterned. Examples of lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In a lithographic apparatus, the substrate table is generally constructed to hold a substrate of only a particular "standard". dimension, e.g. a 200 mm wafer, as this allows the substrate table's design to be optimized for the particular substrate. Various other types of substrate supporting tables, such as found in auxiliary apparatus, substrate handling components, substrate transport devices, etc., are also often designed to handle substrates of a standard size and shape.

However, there are occasions when it is desirable to process a substrate that is either not of a standard size or not of a standard shape. For example, certain substrates, such as InP, GaAs and SiC substrates often have dimensions that are too small for common substrate tables. Also, substrates may have different shapes than the standard. For example, although wafers are often rounded or may be rounded with a flat portion along part of the circumference, other shapes such as squares, rectangles and quarters of a rounded substrate of various sizes may be desirable. Moreover, it may be desirable to process irregular shapes, each of which may be unique, for example, as a result of breakage of a larger substrate into irregular pieces. However, it is relatively cumbersome and expensive to design and build a substrate table tailored to such non-standard substrates. Further, a user may desire to use a single lithographic apparatus to be able to expose a variety of substrates, e.g. both "standard" and "non-standard" substrates.

Furthermore, employing a non-standard substrate in a lithography apparatus designed for a particular standard substrate may raise concerns regarding adequately leveling the non-standard substrate.

Objectives include providing methods and substrate holders alleviating one or more of the above-noted problems.

Substrate holders are mentioned in, for example, U.S. Pat. Nos. 6,583,858 and 6,822,730, and in co-pending U.S. application Ser. No. 11/170,735.

SUMMARY

In an embodiment, a method is provided comprising:
(i) positioning a second substrate on a flat surface of a first substrate at a first position;
(ii) exposing the second substrate to patterned radiation;
(iii) removing the second substrate from the first substrate; and
(iv) positioning the second substrate on said surface of the first substrate at a second position;
wherein
the first and second position overlap to an extent that the second position is shifted at most 500 microns relative to the first position; and
the second substrate is, other than with said surface of the first substrate, not in contact with a physical structure during said exposing.

In an embodiment, a method is provided comprising:
(i) positioning a second substrate on a first substrate;
(ii) positioning a plurality of spacer substrates on said first substrate, said spacer substrates having a thickness differing less than 100 microns from the thickness of said second substrate;
(iii) leveling the second substrate using the spacer substrates.

In an embodiment, a substrate comprising a plurality of alignment marks and a plurality of placement marks is provided. Also provided is a method comprising exposing the substrate to patterned radiation, and devices manufactured by the methods.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
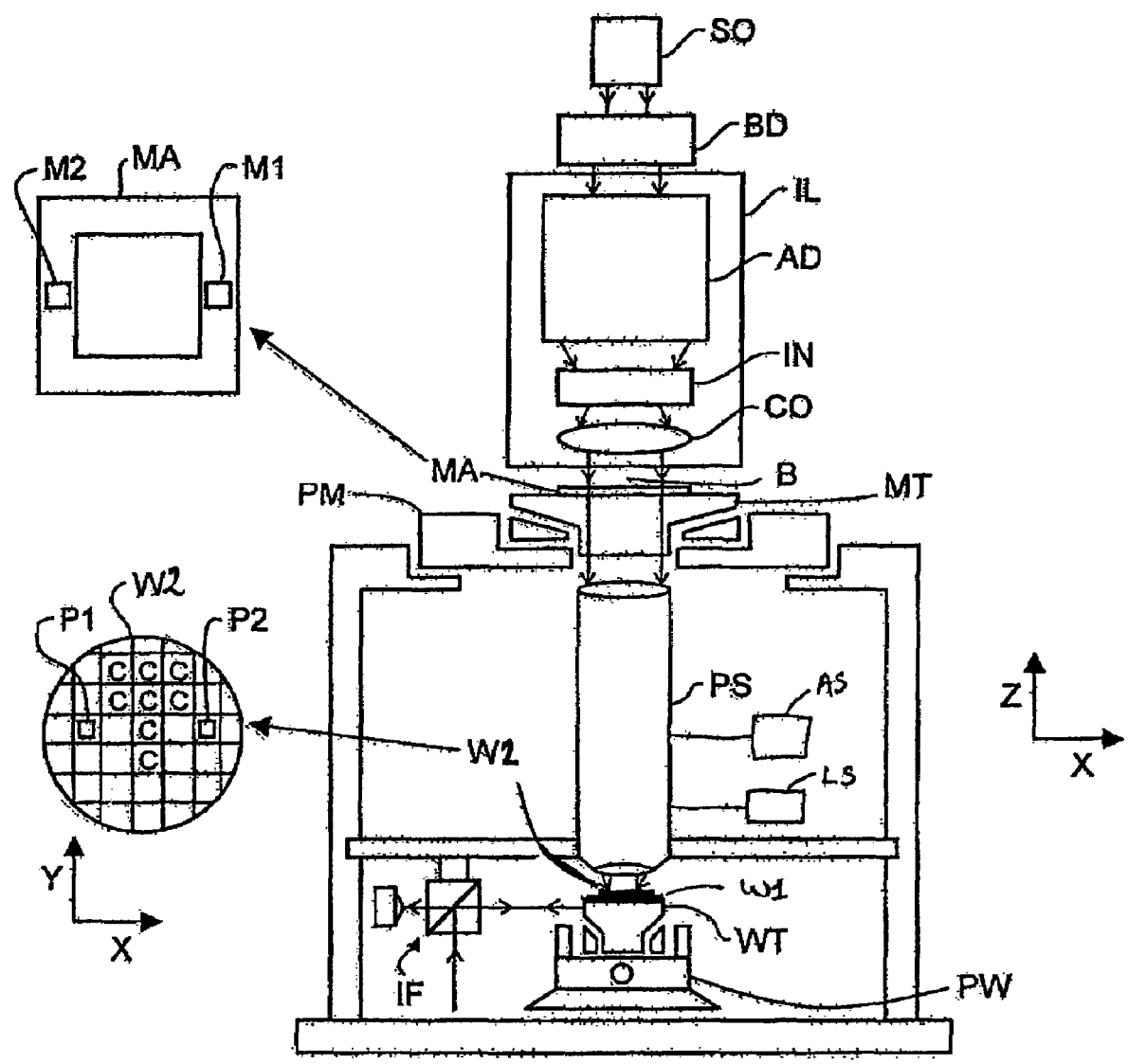
FIG. 1 depicts a lithographic apparatus according to an embodiment of the invention.

FIG. 1 schematically depicts a lithographic apparatus according to one embodiment of the invention. The apparatus comprises: an illumination system (illuminator) IL configured to condition a radiation beam B (e.g. UV radiation, DUV, EUV or x ray radiation); a support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a first substrate W1 and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g.

comprising one or more dies) of a second substrate W2, which is positioned on substrate W1. The substrates W1 and W2 are described in further detail below.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure may use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device".

The term "patterning device" as used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" as used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum.

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases, the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W2. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W2 may be aligned using mask alignment marks M1, M2 and substrate alignment marks P1, P2. The apparatus may comprise an alignment system AS for aligning the substrate to be exposed in the x-y plane with respect to the projection system. The alignment system of the projection system has a capture range within which the substrate is captured if its alignment falls within the capture range. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies. The apparatus may also comprise a leveling system LS which levels the substrate with respect to the projection system. The leveling system may bring the substrate into the capture range of at least one of an autofocus and a focal plane of the projection system. The leveling system LS may comprise a system that "stamps" the substrate at predetermined locations to level the substrate. Also or alternatively, a software solution may be provided to level the substrate. In short, the alignment system aligns the substrate with respect to the projection system in the x-y plane, the leveling system levels the substrate with respect to the projection system in the z direction.

The depicted apparatus may be used in, e.g., one or more of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
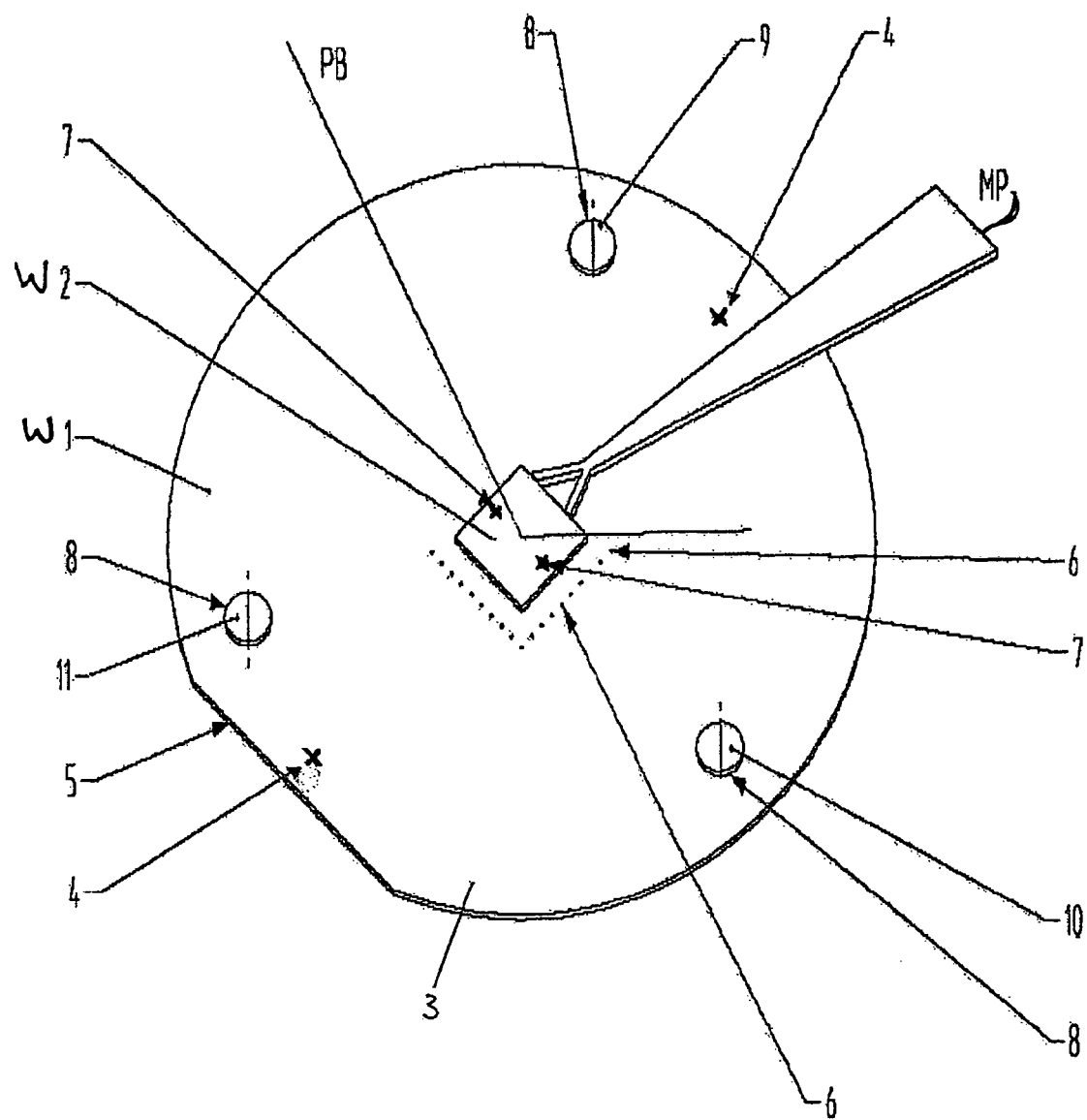
FIG. 2 depicts a view of a first substrate supporting a second substrate according to an embodiment of the invention.

FIG. 2 depicts a view of a first substrate W1 supporting a second substrate W2 according to an embodiment of the invention. The thickness of the first substrate may vary and, to an extent, may depend, e.g., on the substrate material and/or the substrate dimensions. In one embodiment, the thickness is at least 300 μm, e.g. at least 400 μm, at least 500 μm, or at least 600 μm. In one embodiment, the thickness of the substrate is at most 2500 μm, for instance at most 1750 μm, at most 1250 μm, at most 1000 μm, or at most 800 μm. In an embodiment, the first substrate W1 is a standard substrate for a given lithographic apparatus. In an embodiment, the first substrate W1 is a circular substrate, optionally with a notch or a flattened edge 5, having, e.g., a diameter in the range of at least 75 mm, at least 100 mm, at least 150 mm, at least 200 mm, or at least 300 mm. In an embodiment, the diameter is at most than 600 mm, e.g. at most 450 mm, at most 300 mm, at most 200 mm, or at most 150 mm. In an embodiment, the first substrate is a semiconductor substrate e.g. a semiconductor wafer. In an embodiment, the wafer is a silicon wafer, e.g. an 8-inch silicon wafer. In an embodiment, the first substrate is a glass substrate. In an embodiment, the first substrate is a plastic substrate. In an embodiment, the first substrate is a ceramic substrate. In an embodiment, the first substrate is a silicon wafer, e.g. a 4 inch, 5 inch, 6 inch, 8 inch, or 12 inch silicon wafer. In an embodiment, the substrate has a surface that is substantially flat. In an embodiment, the substrate has a polished surface.

The second substrate W2 is positioned on the first substrate. Positioning the second substrate on the first substrate is described in more detail below. The shape of the second substrate may vary. In one embodiment, the second substrate has a substantially circular shape, optionally with a notch and/or a flattened edge along part of its perimeter. In one embodiment, the second substrate has a diameter of 50 mm or less, e.g. 25 mm or less. In an embodiment, the second substrate is a piece obtained from a circular substrate, e.g. a cut-off quarter of a circular substrate. In an embodiment, the second substrate is a polygonal substrate, e.g. a rectangular substrate or a square substrate. In an embodiment, the second substrate is a semiconductor substrate, e.g. a semiconductor wafer. In an embodiment, the second substrate material is selected from the group consisting of Si, SiGe, SiGeC, SiC, Ge, GaAs, InP, and InAs. In an embodiment, the second substrate is a III/V compound semiconductor substrate. In an embodiment, the second substrate is an InP substrate.

The second substrate W2 is positioned on the surface 3 of the first substrate W1. In an embodiment, the surface 3 is substantially flat. In an embodiment, the surface 3 is a polished surface. The first substrate W1 acts as a host for the second substrate W2. Positioning second substrate W2 on first substrate W1 may be done after the first substrate W1 is mounted on the substrate table WT. Preferably, however, the second substrate W2 is already positioned on the first substrate W1 when the first substrate W1 is mounted on the substrate table WT. The projection system PS (refer to FIG. 1) is arranged to project a projection beam, in particular, a patterned beam, onto a target portion C of the second substrate W2. The alignment system AS and leveling system LS ensure that the patterned beam is directed appropriately. The alignment system aligns the substrate to be exposed in an x-y plane with respect to the projection system. The first substrate W1 may comprise primary alignment marks 4. The primary alignment marks 4 may be conventional optical alignment marks, for instance comprising a phase grating, and may also be referred to as global alignment markers; and allow, e.g., the first substrate W1 to be prealigned with respect to the projection system. Alternatively, the primary alignment mark may comprise a notch or a flat portion 5 formed on the substrate, e.g. a flat portion at the edge of the substrate.

The first substrate W1 comprises marks 6. These marks 6, herein referred to as placement marks, allow the second substrate W2 to be reliably positioned within a certain area on the first substrate W1. The placement marks 6 thus do not have to be alignment marks but can take the form of any suitable marks, e.g., dots, lines, etc. The placement marks may be applied by lithographic means or any other suitable means. The placement marks 6 do not form a physical boundary restricting movement of the second substrate W2, such as a wall rising above the surface of W1 or the boundaries of a recess provided in the surface 3 of first substrate W1. In an embodiment, the second substrate W2 when being exposed to radiation touches no physical boundary other than the (flat) surface 3 of the first substrate W1.

The location and arrangement of the placement marks 6 may be selected, e.g., in accordance with the shape of the second substrate. For instance, the user may define the placement marks 6 in accordance with the shape, or range of shapes, of second substrate(s) that are going to be exposed to radiation. A range of shapes may depend, e.g., on the material of the second substrate or whether, for example, the second substrate includes mostly broken or damaged substrates. The placement marks 6 may be provided in any suitable arrangement, e.g. in the form an array, a matrix, a plurality of rows, a scale (e.g. a Vernier scale), a plurality of lines, a grid, etc. In the embodiment shown in FIG. 2, an array of placement marks 6 extends in two directions in a plane in which the first substrate is disposed. For example, the array may be substantially L shaped. Using a suitable liquid, for example water or isopropyl alcohol (IPA), the second substrate W2 may be adhered to the first substrate W1 in the vicinity of the placement marks 6. A micropositioning device MP, which for example may be a conventional probe station, may be used to accurately position the second substrate W2 with respect to the placement marks 6. During the micropositioning of the second substrate, the liquid adhesion force due to the liquid is overcome by the force of the micropositioning device until the final position is achieved. The micropositioning device MP may also comprise a microscope with a pincer or a long distance microscope.

In an embodiment, the first substrate comprises both alignment marks 4 and placement, or reference, marks 6. In an embodiment, the placement marks 6 are closer to the center of the substrate than the alignment marks 4. In an embodiment, the distance between the placement marks and alignment marks is known. In this way, when finding the alignment marks on the first substrate, one obtains an approximation of the location of the second substrate. In an embodiment, the second substrate is positioned within 1000 microns of the placement marks, e.g. within 500 microns, within 250 microns, within 100 microns, within 50 microns, within 30 microns, within 20 microns, or within 10 microns. In an embodiment, the second substrate is positioned over at least part of the placement marks.

Providing placement marks 6 on the first substrate W1 has as further advantage that once the second substrate has been taken off the first substrate, e.g. after a first exposure to radiation, it may be reliably re-positioned at substantially the same position using the placement marks as a reference, e.g. for a second exposure to radiation. In an embodiment, a method is provided comprising positioning the second substrate W2 on the first substrate W1 at a first location, removing the second substrate W2 from the first substrate W1, and re-positioning the second substrate W2 on the first substrate W1 at a second position, wherein the first and second position substantially overlap, e.g. to an extent that any point on the second substrate at the second position has been shifted at most 1000 microns relative to its first position, e.g. at most 500 microns, at most 300 microns, at most 100 microns, at most 50 microns, at most 25 microns, or at most 10 microns. In an embodiment, the shift is smaller than the capture range of the alignment system.

In an embodiment, the second substrate W2 is provided with alignment marks 7. As noted previously, the first substrate W1 may also comprise alignment marks 4. In an embodiment, the alignment marks 4 on the first substrate W1 are used for pre-alignment and the alignment marks 7 on the second substrate W2 for fine alignment.

Figure 3:
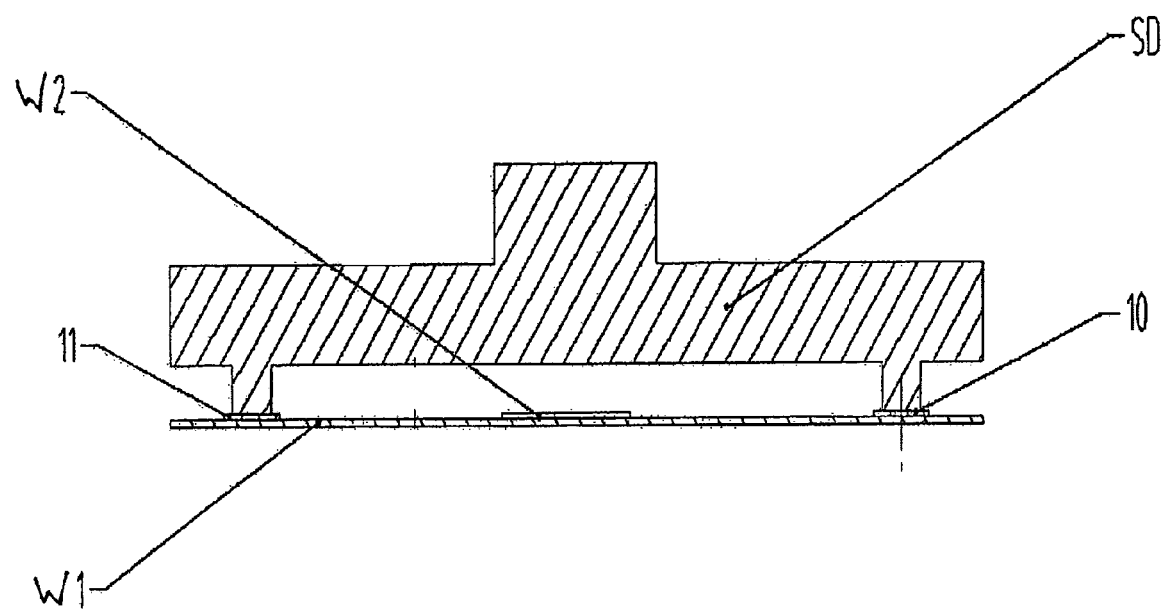
FIG. 3 depicts a first substrate supporting a second substrate according to an embodiment of the invention and a mechanical stamping device.

The second substrate W2 may also be leveled, so that the patterned beam is focused on the second substrate. As mentioned above, depending on the particular lithographic apparatus, leveling may be done using a software solution. Alternatively or in addition, a leveling system LS may employ a mechanical stamping device for global leveling. For example, FIG. 3 depicts a cross section of a first substrate W1 supporting a second substrate W2 according to an embodiment of the invention, and a mechanical stamping device SD. The mechanical stamping device SD as shown in FIG. 3 is a conventional device. It may typically comprise a stamping element which "stamps" the first substrate W1 at a plurality of determined locations 8 (see FIG. 2) to ensure it is within the capture range of the projection system's focusing. However, the stamping device SD, and often also the software solution, are designed to bring the first substrate rather than the second substrate in the capture range. Accordingly, in an embodiment of the present invention, one or more (e.g. 2 or more, 3-10, 3-7, or 3-4) removable spacers (in the Figures designated as 9, 10, 11) are disposed at one or more predetermined locations 8, respectively, corresponding to the one or more locations 8 used by a leveling system LS to determine the level of the substrate W1. Preferably, the spacers 9, 10, 11 have substantially the same thickness as the second substrate W2. The spacers may, for example, be small portions of the second substrate W2. It is not necessary that the spacers 9, 10, 11 be exactly the same thickness as the second substrate W2. In an embodiment, the spacers 9, 10, 11 differ less than 100 microns from the thickness of the second substrate, e.g. less than 75 microns, less than 50 microns, less than 40 microns, less than 30 microns, or less than 20 microns. The spacers 9, 10, 11 may be adhered using a liquid, for example, water or IPA, which acts as a temporary adhesive. In an embodiment, the leveling system LS is arranged to determine the level of the second substrate W2 to within the capture range of a focusing system of the projection system PS. This may be done, e.g., using a leveling beam having a wavelength of, e.g., 820 nanometers. The source of the leveling beam may be an infrared gallium arsenide (GaAs) laser. The leveling system LS determines the level of the spacers, and hence the approximate level of the second substrate W2. In an embodiment, the level of the spacers does not vary from the thickness of the second substrate W2 by more than the capture range of the focusing system of the projection system PS, thereby allowing the focusing system or autofocus of the projection system PS to project a focused patterned beam onto the second substrate W2.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

Having described specific embodiments of the present invention, it will be understood that many modifications thereof will readily be apparent to those skilled in the art, and it is intended therefore that this invention is limited only by the spirit and scope of the following claims.

What is claimed is:

1. A device manufacturing method comprising:
positioning a second substrate on a flat surface of a first substrate at a first position;
exposing a target portion of the second substrate to a patterned beam of radiation projected by a projection system;
removing the second substrate from the first substrate;
positioning the second substrate on said surface of the first substrate at a second position; and
exposing the second substrate to a further patterned beam of radiation projected by the projection system, wherein
the first and second position overlap to an extent that the second position is shifted at most 500 microns relative to the first position; and
the second substrate is, other than with said flat surface of the first substrate, not in contact with a physical structure during said exposing.

2. The method of claim 1, wherein said surface is polished.

3. The method of claim 1, wherein the first substrate is a semiconductor.

4. The method of claim 1, wherein the second substrate is a III/V compound semiconductor.

5. The method of claim 1, wherein said first substrate comprises reference marks and alignment marks.

6. The method of claim 5, wherein said alignment marks are positioned closer to the perimeter of said first substrate than said placement marks.

7. The method of claim 5, wherein one or more of said placement marks are arranged in a substantially L-shaped array.

8. The method of claim 1 wherein said first substrate is a circular substrate.

9. The method of claim 1, wherein the second position is shifted at most 50 microns relative to the first position.

10. The method of claim 1, wherein said first substrate is a wafer selected from the group consisting of 75 mm (3 inch) wafers, 150 mm (6 inch) wafers, 200 mm (8 inch) wafers, and 300 mm (12 inch) wafers.

11. The method of claim 1, wherein one or more additional substrates are placed on said first substrate, said one or more additional substrates having a thickness that differs less than 100 microns from the thickness of said second substrate.

12. The method of claim 5, wherein said reference marks form a scale.

13. The method of claim 5, wherein said reference marks form a grid.

14. The method of claim 1, further comprising aligning the second substrate in an x-y plane with respect to the projection system prior to said exposing the target portion.

15. The method of claim 1, further comprising leveling the second substrate in an x-y plane with respect to the projection system prior to said exposing the target portion.

* * * * *